United States Patent
Kim et al.

(10) Patent No.: US 7,202,524 B2
(45) Date of Patent: Apr. 10, 2007

(54) NONVOLATILE MEMORY DEVICE AND METHOD OF MANUFACTURING THE SAME

(75) Inventors: Ki-chul Kim, Suwon-si (KR); Young-cheon Jeong, Suwon-si (KR); Hyok-ki Kwon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 4 days.

(21) Appl. No.: 11/061,747

(22) Filed: Feb. 22, 2005

(65) Prior Publication Data

US 2005/0173756 A1   Aug. 11, 2005

(30) Foreign Application Priority Data

Dec. 8, 2004  (KR) .................. 10-2004-0103102

(51) Int. Cl.
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |

(52) U.S. Cl. .................. 257/330; 257/314; 257/315; 257/316; 257/317; 257/318; 257/319; 257/320; 257/321; 257/322; 257/323; 257/324; 257/325; 257/326; 257/331; 257/332; 257/333; 257/334

(58) Field of Classification Search ........ 257/314–326, 257/330, 331–334
See application file for complete search history.

(56) References Cited

U.S. PATENT DOCUMENTS

| 4,975,384 A | * | 12/1990 | Baglee ..................... 438/258 |
| 5,146,426 A | * | 9/1992 | Mukherjee et al. ......... 257/316 |
| 5,486,714 A | * | 1/1996 | Hong ......................... 257/321 |
| 5,488,244 A | * | 1/1996 | Quek et al. ................ 257/314 |
| 5,786,612 A | * | 7/1998 | Otani et al. ................ 257/316 |
| 6,078,076 A | * | 6/2000 | Lin et al. ................... 257/321 |
| 6,097,056 A | | 8/2000 | Hsu et al. |

(Continued)

FOREIGN PATENT DOCUMENTS

JP   8316347   11/1996

*Primary Examiner*—Ida M. Soward
(74) *Attorney, Agent, or Firm*—Volentine Francos & Whitt, PLLC

(57) ABSTRACT

A nonvolatile memory device is provided which includes a floating gate having a lower portion formed in a trench defined in a surface of a substrate and an upper portion protruding above the surface of the substrate from the lower portion. A gate insulating layer is formed along an inner wall of the trench and interposed between the trench and the lower portion of the floating gate. A source region is formed in the substrate adjacent a first sidewall of the trench. A control gate having a first portion is formed over the surface of the substrate adjacent a second sidewall of the trench, and a second portion is formed over the upper portion of the floating gate and extending from the first portion. The first sidewall of the trench is opposite the second sidewall of the trench. An inter-gate insulating layer is formed on the upper portion of floating gate and interposed between the floating gate and the control gate, and a drain region is formed in the surface of the substrate adjacent the control gate and spaced from the second sidewall of the trench.

24 Claims, 11 Drawing Sheets

U.S. PATENT DOCUMENTS

| | | | |
|---|---|---|---|
| 6,124,608 A * | 9/2000 | Liu et al. | 257/315 |
| 6,236,082 B1 | 5/2001 | Kalnitsky et al. | |
| 6,239,465 B1 * | 5/2001 | Nakagawa | 257/331 |
| 6,344,393 B1 * | 2/2002 | Liu | 438/259 |
| 6,388,922 B1 * | 5/2002 | Fujiwara et al. | 365/185.18 |
| 6,583,466 B2 * | 6/2003 | Lin et al. | 257/314 |
| 6,781,191 B2 * | 8/2004 | Lin | 257/321 |
| 2002/0000602 A1 * | 1/2002 | Lee | 257/314 |
| 2004/0075137 A1 * | 4/2004 | Lin | 257/332 |
| 2005/0045940 A1 * | 3/2005 | Chen et al. | 257/315 |
| 2005/0224861 A1 * | 10/2005 | Lee et al. | 257/315 |
| 2005/0239249 A1 * | 10/2005 | Rudeck | 438/257 |

* cited by examiner

NONVOLATILE MEMORY DEVICE AND METHOD OF MANUFACTURING THE SAME

BACKGROUND OF THE INVENTION

1. Field of the Invention

The present invention generally relates to a nonvolatile memory device and to a method of manufacturing the same. More particularly, the present invention generally relates to a nonvolatile memory device which exhibits favorable programming and erasing characteristics, and favorable resistance to punch-through, and to a method of manufacturing the same.

A claim of priority is made to Korean Patent Application No. 10-2004-0103102, filed Dec. 8, 2004, the disclosure of which is incorporated herein by reference.

2. Description of the Related Art

In a conventional flash memory device, the gate electrode of a memory cell is constructed of a floating gate and a control gate, where the floating gate is insulated from the control gate by a dielectric layer. More recently, nonvolatile memory devices configured with a double gate structure have been developed. Known as split-gate flash memory devices, these devices require a relatively low erasing voltage by performing an erasing operation from the floating gate to a word line.

FIG. 1 is a cross-sectional view of a conventional split-gate flash memory device. As shown, two floating gates 112 are spaced apart from each other over an active region of substrate 102, and a gate insulating layer 110 is interposed between the substrate 102 and floating gates 112. Likewise, two control gates 122 are formed above the respective floating gates 112 and the substrate 102. A source region 124 is formed in substrate 102 between two floating gates 112, and a drain region 126 is formed in substrate 102 and spaced from source region 124. As shown, a portion of the drain region 126 is overlapped by control gates 122.

The floating gates 112 and respective control gates 122 are insulated from each other by an inter-gate insulating layer 116 and a tunneling insulating layer 118. A channel region L is defined as a region formed below each pair of floating gates 112 and control gates 122.

Control gate 122 acts as a word line, i.e., connected to the word line. Drain region 126 is connected to a bit line and is used to execute data programming, erasing, and reading.

As the need for a higher memory capacity of the flash memory device increases, the size of each unit cell tends to decrease. However, in order to reduce the size of the unit cell, a length Lf of the floating gate 112 and/or a length Lc of the control gate 122 must be reduced. The result is a degradation of cell characteristics.

That is, when the length Lf is reduced, an electron storage area of the floating gate 112, which stores electrons during a programming operation, is also reduced to thereby lower programming efficiency. On the other hand, when the length Lc is reduced, the distance between the drain region 126 and source region 124 is also reduced, which disadvantageously can cause punch-through. Furthermore, when the thickness of the inter-gate insulating layer 116 is increased due to a thermal oxidation process, which is used to decrease the coupling between floating gate 112 and control gate 122 during an erasing operation, a perforation at a center portion of floating gate 112 may occur.

SUMMARY OF THE INVENTION

According to an aspect of the present invention, a nonvolatile memory device is provided which includes a floating gate having a lower portion formed in a trench defined in a surface of a substrate and an upper portion protruding above the surface of the substrate from the lower portion, a gate insulating layer formed along an inner wall of the trench and interposed between the trench and the lower portion of the floating gate, a source region formed in the substrate adjacent a first sidewall of the trench; a control gate having a first portion formed over the surface of the substrate adjacent a second sidewall of the trench, and a second portion formed over the upper portion of the floating gate and extending from the first portion, wherein the first sidewall of the trench is opposite the second sidewall of the trench; an inter-gate insulating layer formed on the upper portion of floating gate and interposed between the floating gate and the control gate, and a drain region formed in the surface of the substrate adjacent the control gate and spaced from the second sidewall of the trench.

According to another aspect of the present invention, a nonvolatile memory device is provided which a floating gate having a lower portion formed in a trench defined in a surface of a substrate and an upper portion protruding above the surface of the substrate from the lower portion, wherein the floating gate has a "U" sectional shape, a gate insulating layer formed along an inner wall of the trench and interposed between the trench and the lower portion of the floating gate, a source region formed in the substrate adjacent a first sidewall of the trench, a control gate having a first portion formed over the surface of the substrate adjacent a second sidewall of the trench, and a second portion formed over the upper portion of the floating gate and extending from the first portion, wherein the first sidewall of the trench is opposite the second sidewall of the trench, an inter-gate insulating layer formed on the upper portion of floating gate and interposed between the floating gate and the control gate, and a drain region formed in the surface of the substrate adjacent the control gate and spaced from the second sidewall of the trench.

According to another aspect of the present invention, a nonvolatile memory device is provided which a floating gate having a lower portion formed in a trench defined in a surface of a substrate and an upper portion protruding above the surface of the substrate from the lower portion, and an angle between a side surface and a bottom surface of the lower portion of the floating gate is substantially an obtuse right angle, a gate insulating layer formed along an inner wall of the trench and interposed between the trench and the lower portion of the floating gate, a source region formed in the substrate adjacent a first sidewall of the trench, a control gate having a first portion formed over the surface of the substrate adjacent a second sidewall of the trench, and a second portion formed over the upper portion of the floating gate and extending from the first portion, wherein the first sidewall of the trench is opposite the second sidewall of the trench, an inter-gate insulating layer formed on the upper portion of floating gate and interposed between the floating gate and the control gate, and a drain region formed in the surface of the substrate adjacent the control gate and spaced from the second sidewall of the trench.

According to another aspect of the present invention, there is provided a method of manufacturing a nonvolatile memory method which includes forming a trench in the surface of a substrate; forming a gate insulating layer along an inner wall of the trench; forming a floating gate on the gate insulating layer such that a lower portion of the floating gate is located within the trench and an upper portion of the floating gate protrudes above the surface of the substrate; forming an inter-gate insulating layer on the upper portion of the floating gate to obtain a resultant structure; forming a tunneling oxide layer on the resultant structure; forming a control gate above the upper portion of the floating gate and along a first sidewall of the upper portion of floating gate; and forming, in the substrate, a source region aligned to the second sidewall of the floating gate and a drain region aligned to a sidewall of the control gate, wherein the first sidewall of the upper portion of the floating gate is opposite the second sidewall of the upper portion of the floating gate.

BRIEF DESCRIPTION OF THE DRAWINGS

The above and other aspects of the present invention will become more apparent by describing in detail exemplary embodiments thereof with reference to the attached drawings in which.

DETAILED DESCRIPTION OF PREFERRED EMBODIMENTS

Figure 1:
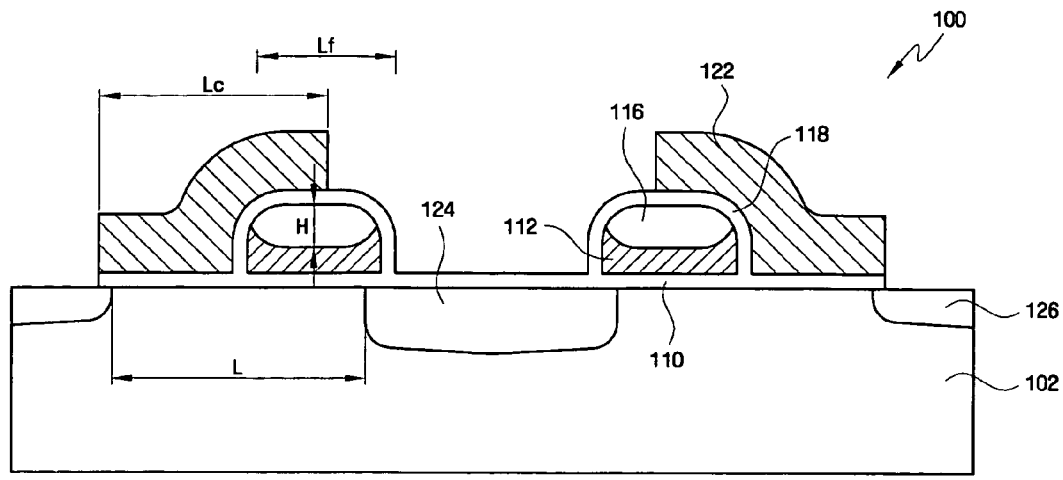
FIG. 1 is a sectional view of a conventional flash memory device.

Aspects of the present invention will be understood more readily by reference to the following detailed description of preferred embodiments and the accompanying drawings. The present invention may, however, be embodied in many different forms and should not be construed as being limited to the embodiments set forth herein. Rather, these embodiments are provided as working examples only. Like reference numerals refer to like elements throughout the specification. It will be understood that when an element such as a layer, a region or a substrate is referred to as being "on" or "onto" another element, it can be directly on the other element or intervening elements may also be present.

Hereinafter, embodiments of the present invention will be described in detail with reference to the accompanying drawings.

Figure 2:
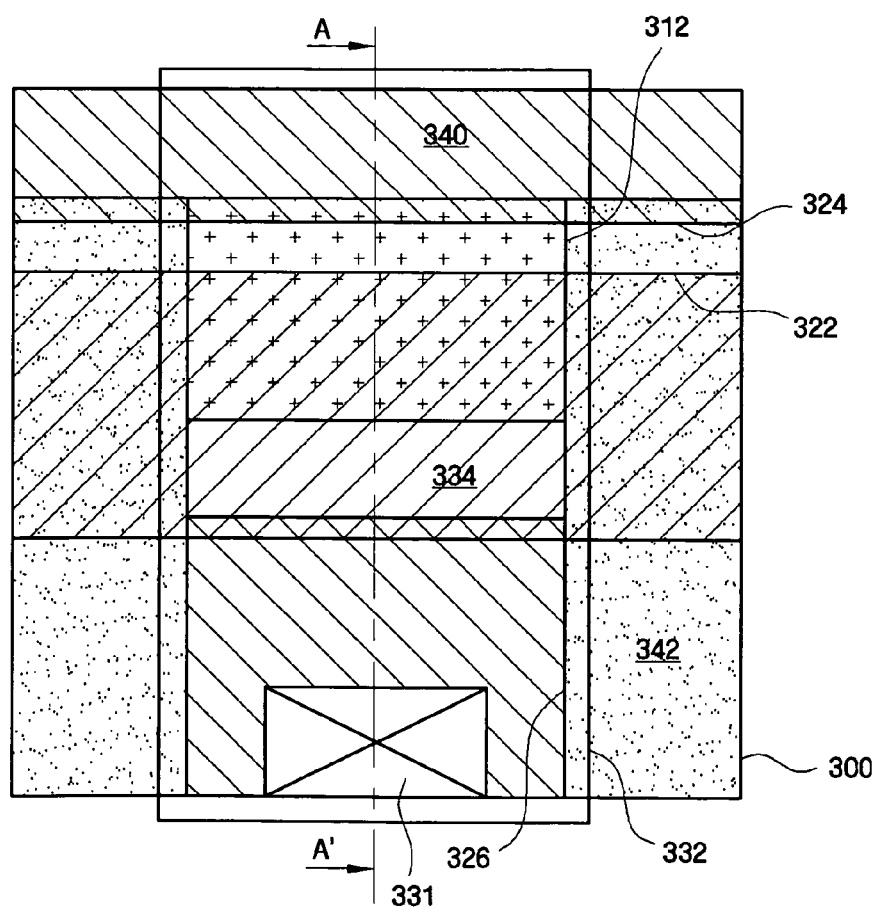
FIG. 2 is a view illustrating a basic layout of a nonvolatile memory device according to all first embodiments of the present invention.
Figure 3A:
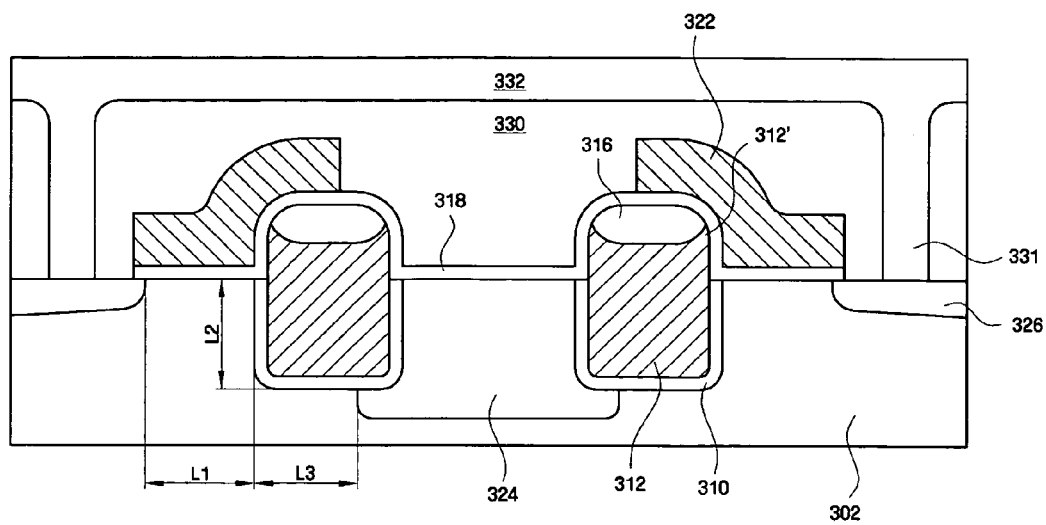
FIG. 3A is a sectional view taken along a line A–A' of FIG. 2.

Referring to FIGS. 2 and 3A, a nonvolatile memory device of an embodiment of the present invention includes a substrate 302 has an active region 340 and a field region 342. Substrate 302 is preferably a silicon substrate, a SOI (Silicon on Insulator) substrate, a gallium arsenic substrate, a silicon germanium substrate, a ceramic substrate, a quartz substrate, or a glass substrate for a display device. Reference numeral 300 indicates a unit cell of a nonvolatile memory device.

The nonvolatile memory device further includes a floating gate 312, a control gate 322, a source region 324, and a drain region 326.

A trench is formed in substrate 302 at a predetermined portion of active region 340. A gate insulating layer 310 is formed on walls of the trench. Floating gate 312 is formed on gate insulating layer 310. Gate insulating layer 310 insulates floating gate 312 from substrate 302. Specifically, a first portion (lower portion) of floating gate 312 is disposed in the trench, and a second portion (upper portion) is disposed above substrate 302. During a programming operation, gate insulating layer 310 transfers a voltage applied to source region 324 to floating gate 312 by coupling the voltage to floating gate 312. Furthermore, during the programming operation, hot electrons injected from source region 324 to drain region 326 and through gate insulating layer 310 accumulate in floating gate 312.

As shown in FIG. 3A, an inter-gate insulating layer 316 is formed on floating gate 312. Floating gate 312 is preferably formed with a tip 312' on the second portion. In other words, the second portion of floating gate 312 is formed in a concave shape where floating gate 312 contacts inter-gate insulating layer 316. An electric field is concentrated on tip 312', therefore, low-voltage Fowler-Nordheim (FN) tunneling is induced during an erasing operation.

Control gate 322 is disposed on a portion of floating gate 312 and extends to substrate 302 along a sidewall of floating gate 312. Control gate 322 is insulated from floating gate 312 and substrate 302. Specifically, a tunneling insulating layer 318 is formed between floating gate 312 and control gate 322 to electrically insulate control gate 322 from floating gate 312. Electrons stored in floating gate 312 are pulled into control gate 322 through tunneling insulating layer 318 by FN tunneling during an erasing operation.

Control gate 322 performs data transfer between a bit line 332 and a cell during data programming or reading operation. Control gate 322 also preferably serves as an erase gate during the erasing operation.

As shown in FIG. 2, bit line 332 which is electrically contacted with drain region 326 intersects with control gate 322. Also, as shown in FIG. 3A, floating gate 312 is formed in pairs, and the gates preferably share source region 324. This structure reduces the size of the nonvolatile memory array.

Source region 324 is aligned between sidewalls of two floating gate 312, not overlapping control gate 322. Drain region 326 is aligned to one end of control gate 322.

The operation of the nonvolatile memory device according to the first embodiment of the present invention will now be described with reference to FIG. 3A.

During a programming operation, a high voltage of about 10V is applied to source region 324, and a voltage of 1V or less is applied to drain region 326. Drain region 326 is preferably grounded. A slightly higher voltage than a threshold voltage is applied to control gate 322. To decrease a current flow during the programming operation, about 1.5V (gate turn-on voltage) is applied to control gate 322. The high voltage applied to source region 324 is coupled to and applied to floating gate 312 through gate insulating layer 310, and the voltage applied to floating gate 312 forms an inversion layer on surfaces of substrate 302 surrounding floating gate 312. The voltage applied to control gate 322 forms an inversion layer on a surface of substrate 302 below control gate 322. Electrons are injected from source region 324 to drain region 326 through gate insulating layer 310, and accumulate in floating gate 312 by hot electron injection.

Therefore, even if a high voltage is applied to source region 324 to increase programming efficiency or the width of control gate 322 is reduced to decrease the size of the unit cell, a breakdown phenomenon such as punch-through is effectively reduced because a channel area (L1+L2+L3) is increased. Also even if the width of floating gate 312 is reduced to decrease the size of the unit cell, floating gate 312 has sufficient area to store injected electrons, because floating gate 312 extends down into a trench in substrate 302, i.e., the surface area of floating gate 312 is increased. Further, since the first portion of floating gate 312 is lower relative to that of control gate 322, hot electrons injection both in the vertical and lateral directions with respect to floating gate 312 are possible, which decreases an operating voltage when a memory cell is driven, in particular, during a programming operation.

In addition, multi-level cell operation can be performed by adjusting a programming time. That is, since the amount of electrons injected in floating gate 312 can be adjusted by adjusting a programming time, the amount of electrons accumulated in floating gate 312 can be controlled on a multi-level. For example, a programmed state can be classified according to the amount of electrons injected in floating gate 312: no electrons in floating gate 312 (first state); floating gate 312 is half filled with electrons (second state); and, floating gate 312 is completely filled with electrons (third state), therefore, increasing the memory integration of the nonvolatile memory device.

During an erasing operation, a zero potential is applied to source region 324 and drain region 326, and a high voltage of about 11V or more is applied to control gate 322. Therefore, electrons accumulated in floating gate 312 are pulled to control gate 322 through tunneling insulating layer 318 by FN tunneling due to the attraction of the high voltage of control gate 322.

Tip 312' lowers the voltage of control gate 322 for tunneling. Specifically, an electric field is concentrated on tip 312', electrons accumulated in floating gate 312 are pulled to control gate 322 through tunneling insulating layer 318 near tip 312'.

During a reading operation, a voltage of 1–2V is applied to control gate 322, a ground voltage is applied to source region 324, and a voltage of 0.4–1V is applied to drain region 326. Alternatively, a voltage of 1–2V is applied to control gate 322, a voltage of 0.4–1V is applied to source region 324, and a ground voltage is applied to drain region 326. Therefore, if electrons accumulate in floating gate 312, no channel between drain region 326 and source region 324 are induced, therefore, no current flows. On the other hand, if no electrons accumulate in floating gate 312, a channel between drain region 326 and source region 324 is induced, therefore, a current flows. In this regard, accumulation of electrons in floating gate 312 can be determined by detecting the current flow between drain region 326 and source region 324, and reading of the stored data is performed.

Figure 3B:
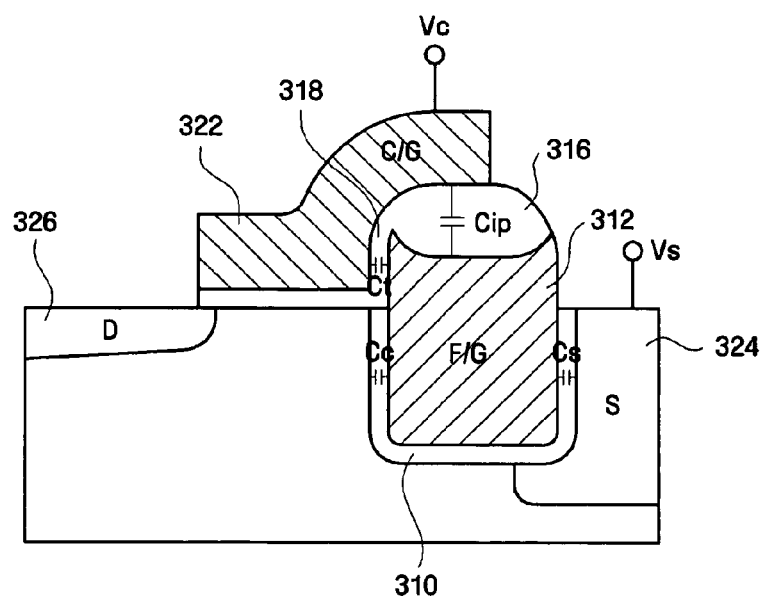
FIG. 3B is a schematic sectional view illustrating an operation of the nonvolatile memory device of FIG. 2.

Programming and erasing operations of the nonvolatile memory device according to the first embodiment of the present invention will now be described in detail with reference to FIG. 3B.

The total cell capacitance ($C_{total}$) is defined as $C_{total}=C_t+C_c+C_s+C_{ip}$. Here, $C_t$ a capacitance of tunneling insulating layer 318 interposed between floating gate 312 and control gate 322; $C_c$ is a capacitance of gate insulating layer 310 interposed between floating gate 312 and substrate 302; $C_s$ is a capacitance of gate insulating layer 310 interposed between floating gate 312 and source region 324; and $C_{ip}$ is a capacitance of inter-gate insulating layer 316 interposed between floating gate 312 and control gate 322.

A coupling ratio (r) of a nonvolatile memory device of the present invention is represented as follows:

$$r = \frac{C_s + C_c}{C_{total}} V_s + \frac{C_{ip} + C_t}{C_{total}} V_C$$

where $V_s$ is a voltage applied to source region 324 and $V_c$ is a voltage applied to control gate 322.

During a programming operation, since voltage $V_s$ applied to source region 324 is much higher than voltage $V_c$ applied to control gate 322, i.e., $V_s >> V_c$, the coupling ratio (r) for the programming operation is defined as $(C_s+C_c)/C_{total}$. In a nonvolatile memory device of the present invention, the programming operation is performed by a coupling between floating gate 312 and source region 324. In this respect, as coupling ratio (r) is higher, the programming operation is performed at high efficiency. As shown in FIG. 3B, floating gate 312 is formed along a trench in substrate 302, and source region 324 is formed along a sidewall of two floating gate 312. Therefore, an overlapping area between source region 324 and floating gate 312 is increased over the conventional structure. Accordingly, capacitance $C_s$ between source region 324 and floating gate 312 is increased, which increases coupling ratio (r) and lowers the operating voltage during the programming operation.

During an erasing operation, since voltage $V_c$ applied to control gate 322 is much higher than voltage $V_s$ applied to source region 324, i.e., $V_c >> V_s$, coupling ratio (r) for the erasing operation is defined as $(C_{ip}+C_t)/C_{total}$. In a nonvolatile memory device of the present invention, the erasing operation is performed by FN tunneling of electrons accumulated in floating gate 312 to control gate 322. In this respect, to perform efficient erasing operation, it is preferable to increase the voltage difference between floating gate 312 and control gate 322. That is, by decreasing coupling ratio (r), the erasing operation is performed at high efficiency. As shown in FIG. 3B, when a high voltage is applied to control gate 322 during an erasing operation, the voltage of floating gate 312 can be increased by a coupling between control gate 322 and floating gate 312. However, when source region 324 set to zero potential, and because source region 324 overlaps with floating gate 312 in a large area, the coupling effect of control gate 322 on floating gate 312 is decreased. Therefore, the erasing operation can be performed by applying a relatively low voltage to control gate 322. Furthermore, as the thickness of inter-gate insulating layer 316 interposed between floating gate 312 and control gate 322 increases, the capacitance $C_{ip}$ of inter-gate insulating layer 316 decreases, which decreases coupling ratio (r).

In the first embodiment of the present invention, the first portion of floating gate 312 extends to the bottom of a trench formed in substrate 302. Therefore, even if inter-gate insulating layer 316 is formed relatively thick, perforation at a center portion of floating gate 312 is reduced. As a result, coupling ratio (r) for an erasing operation is decreased, which ensures efficient erasing operation.

A method of manufacturing a nonvolatile memory device according to a first embodiment of the present invention will be described with reference to FIGS. 4A through 4G.

FIGS. 4A through 4G are sequential sectional views, taken along line A–A' of FIG. 2, illustrating the method of manufacturing the nonvolatile memory device according to the first embodiment of the present invention.

Figure 4A:
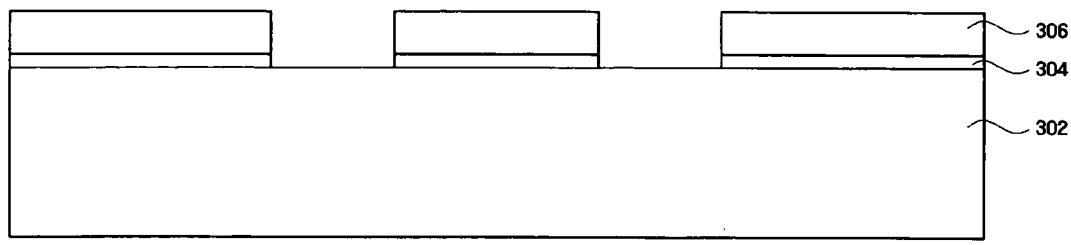
FIGS. 4A through 4G are sequential sectional views illustrating a method of manufacturing a nonvolatile memory device according to a first embodiment of the present invention.

Referring to FIGS. 2 and 4A, a substrate 302 is divided into an active region 340 and a field region 342 by a Shallow Trench Isolation (STI) process for cell isolation. An oxide layer pattern 304 and an antioxidation layer pattern 306 to define a trench are sequentially formed on substrate 302. Antioxidation layer pattern 306 serves as an etching mask in both subsequent etching processes to form the trench and a floating gate, respectively. Antioxidation layer pattern 306 is preferably a nitride layer and formed to a thickness of about 100–1,000 Å. Oxide layer pattern 304 serves to decrease the stress between substrate 302 and antioxidation layer pattern 306, and is preferably formed to a thickness of about 100–200 Å. However, oxide layer pattern 304 may be omitted depending on process conditions.

Figure 4B:
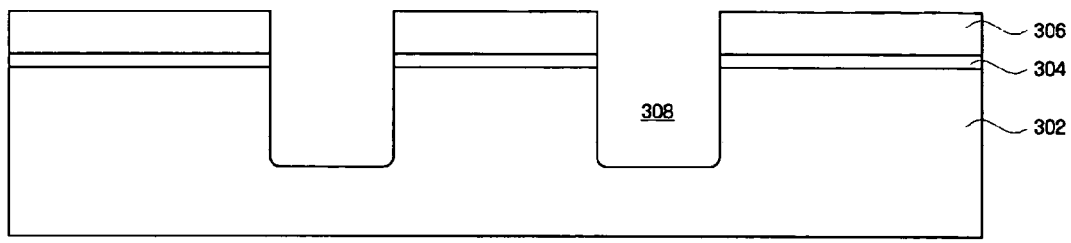

Referring to FIG. 4B, an exposed portion of substrate 302 is etched using antioxidation layer pattern 306 as an etching mask to form a trench 308 in substrate 302. For example, trench 308 is preferably formed to a width of about 900–1,800 Å and a depth of about 500–3,000 Å by a dry etching process.

Figure 4C:
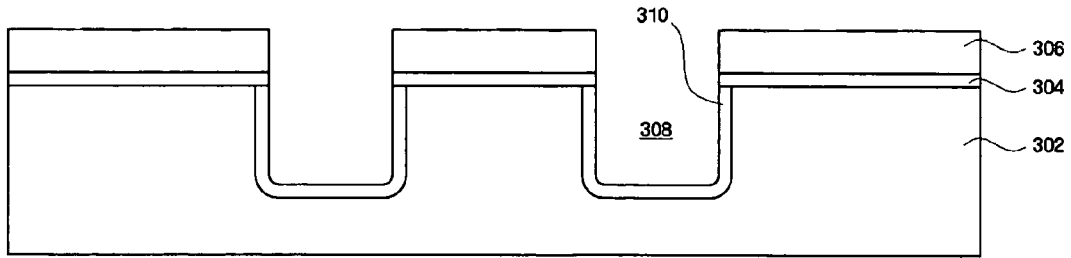

Referring to FIG. 4C, a gate insulating layer 310 is formed in trench 308. Gate insulating layer 310 is preferably formed to a thickness of about 30–150 Å. Gate insulating layer 310 is preferably a thermal oxide layer.

To increase efficient programming operations, gate insulating layer 310 is preferably made of a high dielectric constant (k) material. For example, gate insulating layer 310 is preferably made of a material of nitride, oxinitride, a high-k material, or a combination thereof. The high-k material is an oxide of Al, Zr, Hf, La, and an oxinitride of Al, Zr, Hf, La, or a combination thereof. Gate insulating layer 310 may also be formed by $N_2O$ annealing a mono-layer made of Middle Temperature Oxide (MTO) or a multi-layer made of thermal oxide/MTO or thermal oxide/SiON/MTO. Gate insulating layer 310 allows for efficient electron injection into and efficient electron storage in a floating gate (312 of FIG. 4D).

Gate insulating layer 310 may also be an oxide-nitride-oxide (ONO) layer in which layers of oxide, nitride, and oxide are stacked. In this case, since electrons can also be injected into the nitride layer of gate insulating layer 310, multi-level cell operation can be performed to increase memory integration. However, instead of the nitride layer in the ONO layer, a layer made of the above-described high-k material or a multi-layer obtained by alternately stacking a high-k material layer and a nitride layer can be used. In the case of using such a multi-layer, an interface capable of capturing injected electrons is used to increase programming efficiency.

Furthermore, to efficiently store and maintain electrons injected into floating gate 312, an inner wall of trench 308 is advantageously subjected to a nitridation process prior to formation of gate insulating layer 310. For example, when an exposed portion of the substrate 302 in trench 308 is subjected to a Decoupled Plasma Nitridation (DPN) process prior to the formation of gate insulating layer 310, a threshold voltage ($V_{th}$) is decreased, which enhances floating gate 312 characteristics. The threshold voltage ($V_{th}$) may also be decreased by ion implanting an inner wall of trench 308 with an n-type impurity such as arsenic (As).

Figure 4D:
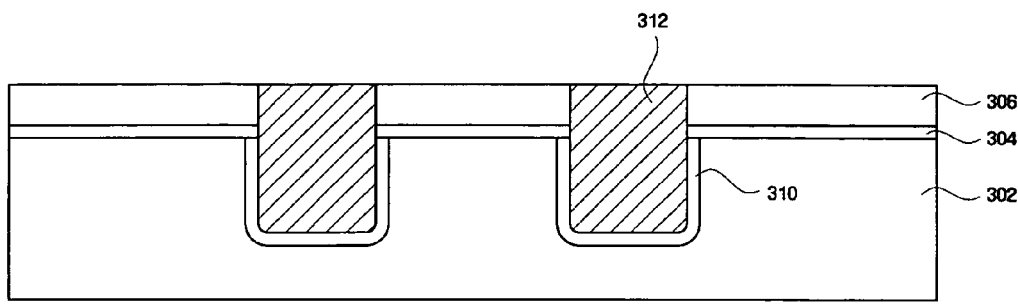

Referring to FIG. 4D, a conductive layer is coated in gate insulating layer 310, and then a Chemical Mechanical Polishing (CMP) process is performed using antioxidation layer pattern 306 as an etch stop film to form a planarized floating gate 312. Floating gate 312 is preferably a polysilicon layer, a polysilicon layer obtained by an ion implantation process, or a metallic conductive layer. Here, the metallic conductive layer is made of TaN, NiTa, Ti, TiN, Ta, W, WN, Hf, Nb, Mo, $RuO_2$, $Mo_2N$, Ir, Pt, Co, Cr, RuO, $Mo_2N$, WNx, or a combination thereof. The planarization process may be performed by an anisotropic etching process or an etch-back process, in addition to the above-described CMP process.

Figure 4E:
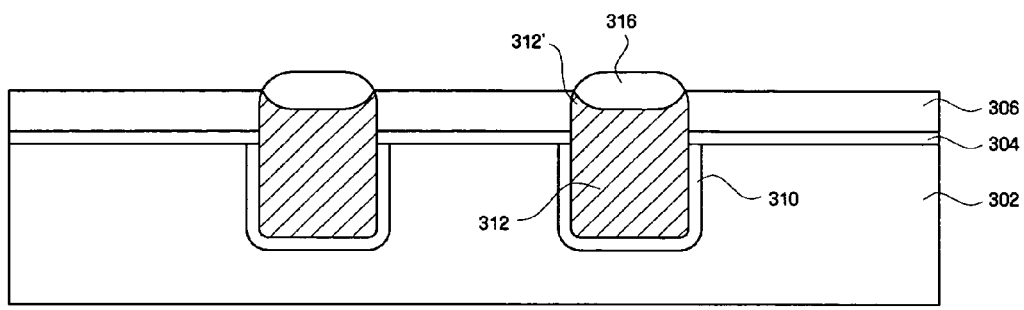

Referring to FIG. 4E, an inter-gate insulating layer 316 is formed by performing a thermal oxidation process on an upper surface of floating gate 312. Inter-gate insulating layer 316 can serve as an etch stop film for a subsequent etching process. A width at the center of inter-gate insulating layer 316 is preferably formed to a thickness of about 200–1,500 Å. When the upper surface of floating gate 312 is thermally oxidized, a lower edge of inter-gate insulating layer 316 forms a convex shape, which means that the top of the second portion of floating gate 312 contacting the inter-gate insulating layer 316 forms a tip 312'. The formation of tip 312' may be omitted depending on process conditions.

Tip 312' may optionally be formed by dry etching the upper surface of floating gate 312 instead of the thermal oxidation process, and then followed by forming an insulating layer such as a MTO layer coated on floating gate 312 followed by a patterning of inter-gate insulating layer 316. Tip 312' may also optionally be formed by dry etching the upper surface of floating gate 312, and then followed by a thermal oxidation process to form inter-gate insulating layer 316.

Figure 4F:
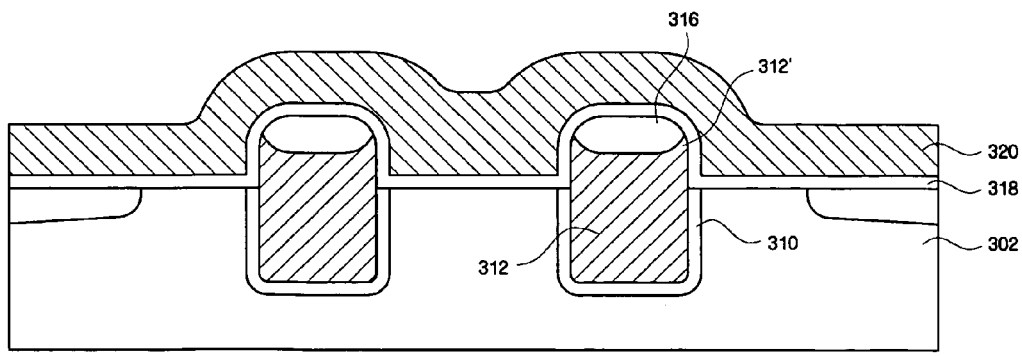

Referring to FIG. 4F, antioxidation layer pattern 306 and oxide layer pattern 304 are sequentially etched to expose substrate 302. Then, a tunneling insulating layer 318 and a conductive layer 320 are sequentially formed on substrate 302. Tunneling insulating layer 318 is preferably formed of an oxide layer to a thickness of about 70–150 Å by a thermal oxidation process. Tunneling insulating layer 318 is also preferably of nitride, oxinitride, a high-k material, or a combination thereof. Tunneling insulating layer 318 may be a mono-layer made of MTO, a multi-layer made of thermal oxide/MTO or thermal oxide/SiON/MTO, or an insulating layer obtained by $N_2O$ annealing the multi-layer.

After the formation of tunneling insulating layer 318, a sidewall spacer (not shown) made of nitride may be formed at both sidewalls of floating gate 312 to prevent a Reverse Tunnel Voltage (RTV), which may be generated when a memory cell is driven.

Conductive layer 320 is preferably formed to a thickness of about 1,000–3,000 Å by a Low Pressure Chemical Vapor Deposition (LPCVD) process. Conductive layer 320 is preferably a polysilicon layer, a polysilicon layer obtained by ion implanting impurities, or a metallic conductive layer. The metallic conductive layer is preferably TaN, NiTa, Ti, TiN, Ta, W, WN, Hf, Nb, Mo, $RuO_2$, $Mo_2N$, Ir, Pt, Co, Cr, RuO, $Mo_2N$, WNx, or a combination thereof. Conductive layer 320 may be a stacked layer composed of a polysilicon layer and a silicide layer. An antireflective layer (ARL) may be further deposited on the silicide layer. A P—SiON layer may be used as the ARL layer. Generally, if the reflection of an underlying layer is too high due to a reduction in the device design rule, a poor pattern may be formed. The ARL layer is formed on the silicide layer to solve this problem.

Figure 4G:
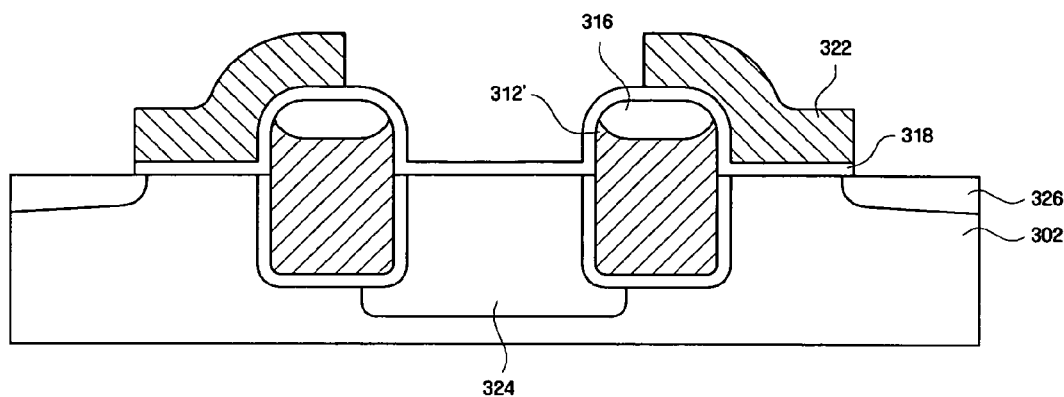

Referring to FIG. 4G, conductive layer 320 is dry-etched using an etching mask (not shown) to form a control gate 322 on a portion of floating gate 312 and extending to substrate 302 along a sidewall of floating gate 312. Then, a high concentration of impurity is ion-implanted into substrate 302 between two floating gates 312 to form a source region 324. Source region 324 extends to partially overlap under floating gate 312 by a subsequent heat treatment process. Also, a high concentration of impurity is ion-implanted into substrate 302 to form a drain region 326 aligned to a sidewall of control gate 322. Drain region 326 also extends to substrate 302 below control gate 322 by a subsequent heat treatment process.

To increase the coupling ratio between floating gate 312 and source region 324, a junction depth of source region 324 can be adjusted by controlling the ion implantation conditions. Preferably, the coupling ratio is increased by forming source region 324 with a deeper junction depth than the depth of floating gate 312, which is advantageous for programming operations.

There are no limitations on the formation sequence of source region 324 and drain region 326. Control gate 322 can be doped with a high concentration of impurity simultaneously during the formation of source region 324 and drain region 326. Drain region 326 serves as a bit line junction contacting a bit line (332 of FIGS. 2 and 3A).

Thereafter, referring to FIG. 3A, an inter-insulating layer 330 is formed on the entire surface of the resultant structure and planarized to form a bit line contact hole. Then, a conductive layer such as a metal layer is deposited and patterned to form a bit line contact 331 and a bit line 332.

Figure 5:
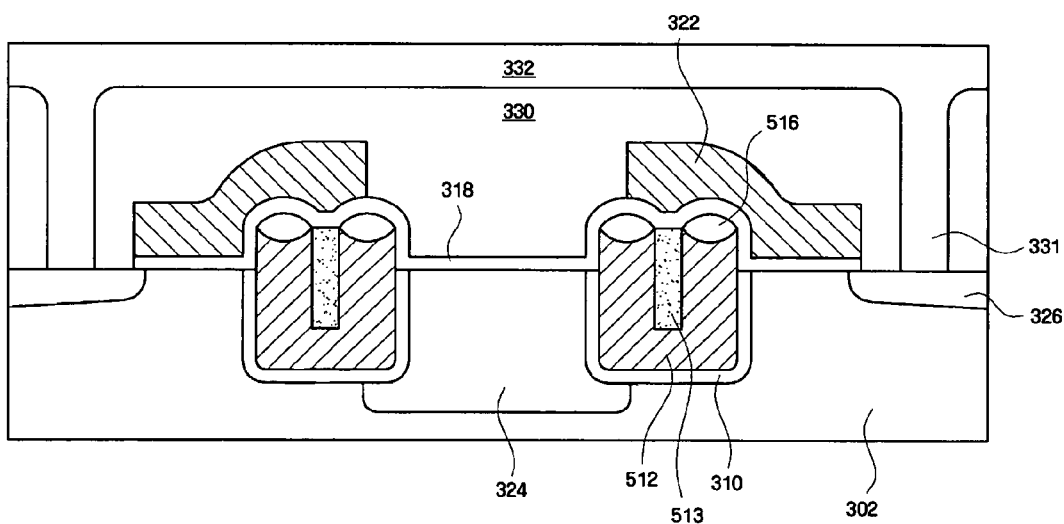
FIG. 5 is a sectional view of a nonvolatile memory device according to a second embodiment of the present invention.

A nonvolatile memory device according to a second embodiment of the present invention will be described with reference to FIGS. 5 through 6D. FIG. 5 is a sectional view taken along line A–A' of FIG. 2. For convenience of illustration, the same reference numerals as in the first embodiment refer to the same constitutional elements, and thus, the detailed descriptions thereof are omitted.

A floating gate 512 having a recess to define a "U" sectional shape is formed in a trench of a substrate 302. Floating gate 512 of this embodiment is made of the same materials and exhibits similar behaviors and effects as floating gate 312 of the first embodiment. Floating gate 512 has a larger surface area capable of storing injected electrons.

An inter-gate insulating layer 516 is formed on each end of the "U" on the upper portion of floating gate 512. In other words, each floating gate 512 has two inter-gate insulating layer 516 formed thereon. Inter-gate insulating layer 516 is made of the same materials and exhibits similar behaviors and effects as an inter-gate insulating layer 316 of the first embodiment.

A fold portion of the "U" shape floating gate 512 is filled with an insulating material 513. Insulating material 513 is preferably an oxide such as MTO or nitride.

The nonvolatile memory device of the second embodiment executes the same operations as that of the first embodiment. A method of manufacturing a nonvolatile memory device according a second embodiment of the present invention will now be described with reference to FIGS. 6A through 6D.

First, a gate insulating layer 310 is formed in a trench of a substrate 302, as described with reference to FIGS. 4A through 4C.

Figure 6A:
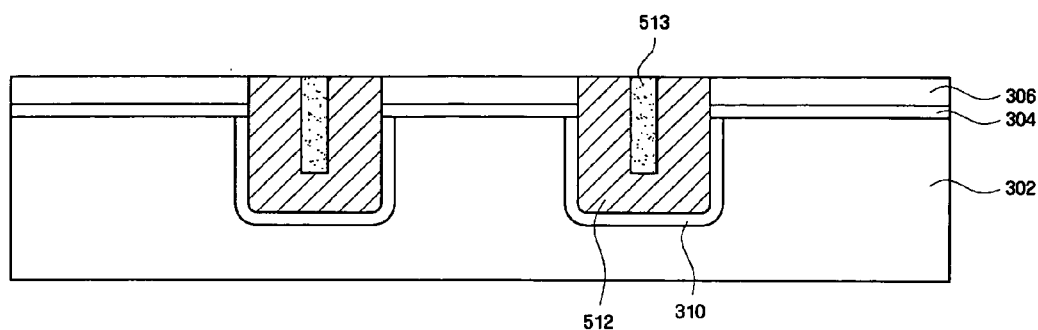
FIGS. 6A through 6D are sequential sectional views illustrating a method of manufacturing a nonvolatile memory device according to a second embodiment of the present invention.

Referring to FIG. 6A, a conductive layer (not shown) is formed to a sufficient thickness on gate insulating layer 310. The remaining portion of the trench, including a gap is filled with an insulating material 513. Then, a floating gate 512 having a "U" sectional shape is formed by a CMP process using an antioxidation layer pattern 306 as an etch stop film. The gap of floating gate 512 is filled with insulating material 513.

Figure 6B:
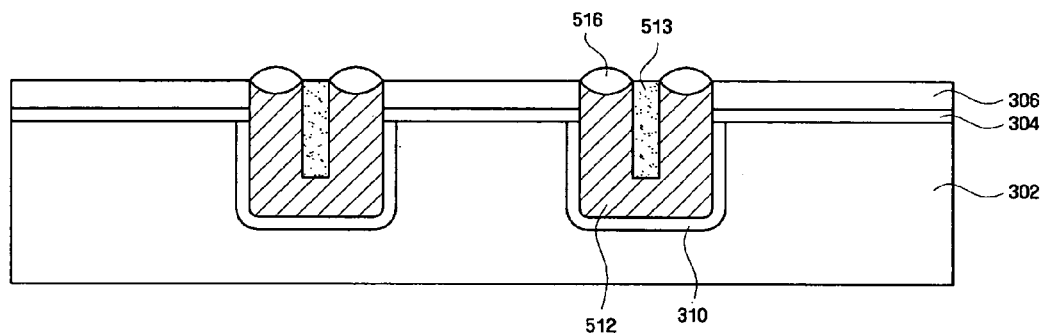
Figure 6C:
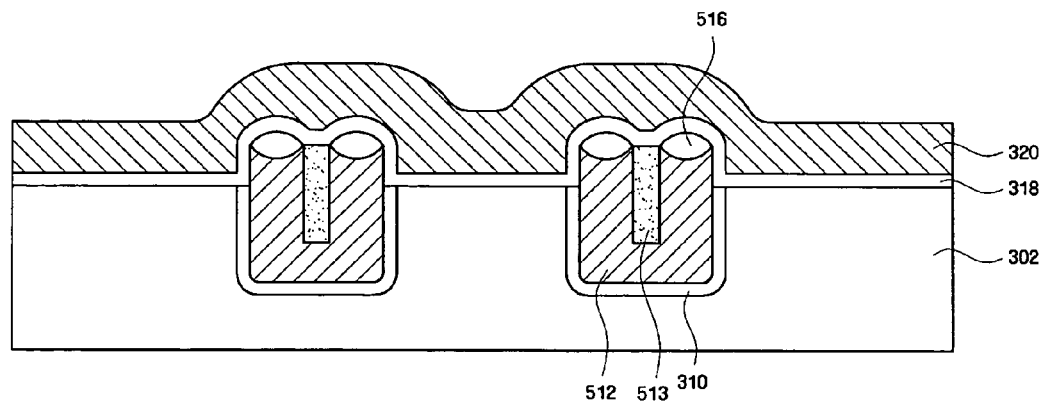
Figure 6D:
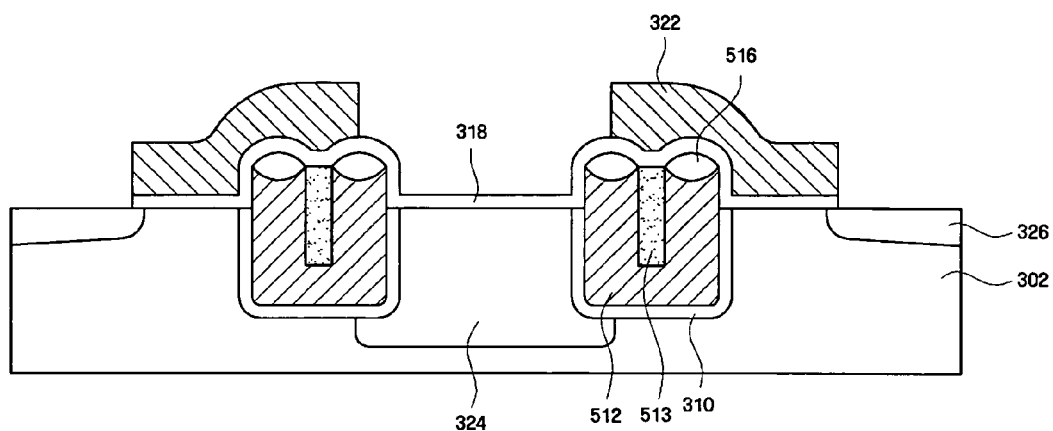

Referring to FIG. 6B, exposed portions of an upper surface of floating gate 512 and insulating material 513 are thermally oxidized to form an inter-gate insulating layer 516. Then, referring to FIGS. 6C and 6D, a control gate 322, a source region 324, and a drain region 326 are formed in a similar manner as the first embodiment to complete the nonvolatile memory device according to the second embodiment of the present invention.

Figure 7:
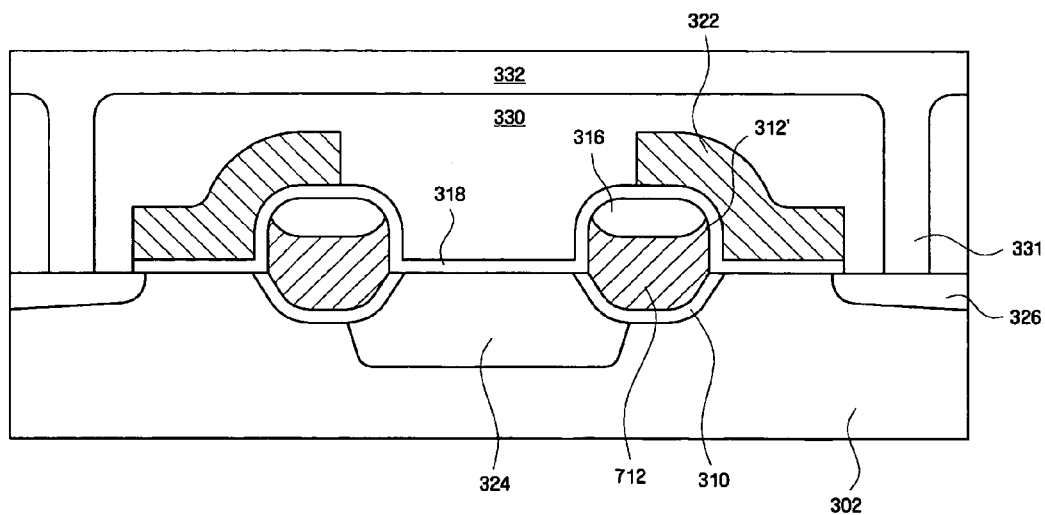
FIG. 7 is a sectional view of a nonvolatile memory device according to a third embodiment of the present invention.

Hereinafter, a nonvolatile memory device according to a third embodiment of the present invention will be described with reference to FIGS. 7 through 8G. The basic layout of the nonvolatile memory device according to this embodiment is shown in FIG. 2. FIG. 7 is a sectional view taken along line A–A' of FIG. 2. For convenience of illustration, the same reference numerals as in the first embodiment refer to the same constitutional elements, and thus, the detailed descriptions thereof are omitted.

A lower portion of a trench formed in a substrate 302 have a round shape. Therefore, first a portion (lower portion) a floating gate 712 is round correspondingly to the shape of the trench. A second portion (upper portion) floating gate 712 is also round. Floating gate 712 of this embodiment is made of the same materials and exhibits the similar operations, behaviors, and effects as floating gate 312 of the first embodiment. Only the shape of the floating gate is different.

The nonvolatile memory device according to the third embodiment of the present invention executes the same operations, and thus exhibits the same behaviors and effects as that of the first embodiment. A method of manufacturing a nonvolatile memory device according to a third embodiment of the present invention will now be described with reference to FIGS. 8A through 8G.

Figure 8A:
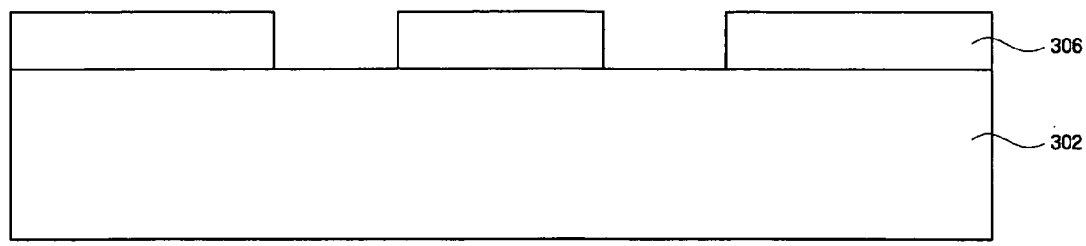
FIGS. 8A through 8G are sequential sectional views illustrating a method of manufacturing a nonvolatile memory device according to a third embodiment of the present invention.

Referring to FIG. 8A, an antioxidation layer pattern 306 defining a trench is formed on a substrate 302. Antioxidation layer pattern 306 serves as a mask in a subsequent thermal oxidation process for a trench formation. Antioxidation layer pattern 306 also preferably serves as a mask in a subsequent process to form a floating gate. Antioxidation layer pattern 306 is preferably a nitride layer, and is formed to a thickness of about 100–1,000 Å.

Figure 8B:
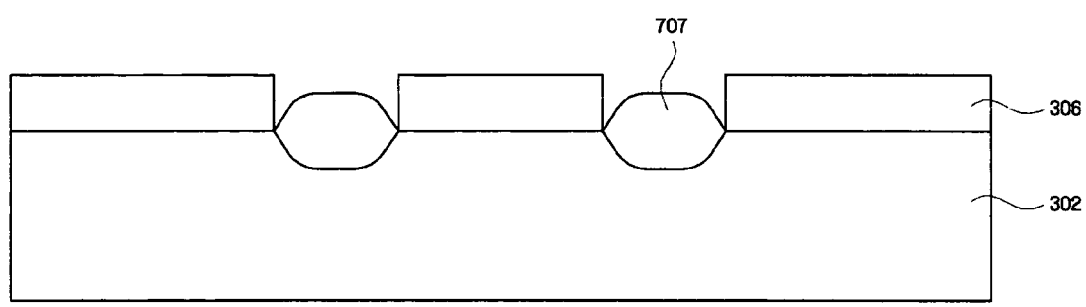

Referring to FIG. 8B, an exposed surface of substrate 302 is thermally oxidized using antioxidation layer pattern 306 as a mask to form a thermal oxide layer 707 in the exposed portion of substrate 302. Since antioxidation layer pattern 306 is used as a mask in the thermal oxidation process during the trench formation, a bird's beak at a lower portion of antioxidation layer pattern 306 is not formed.

Figure 8C:
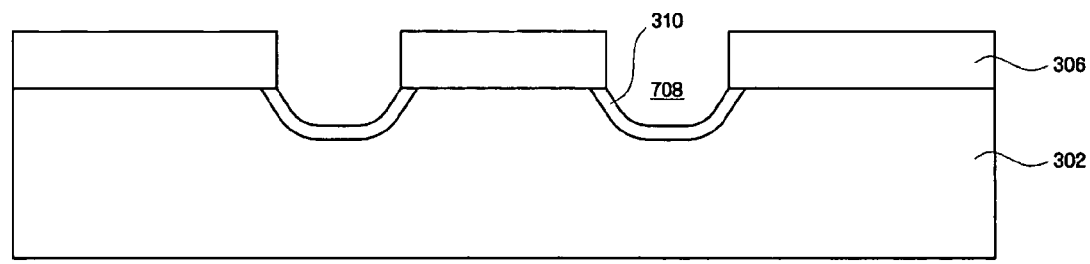
Figure 8D:
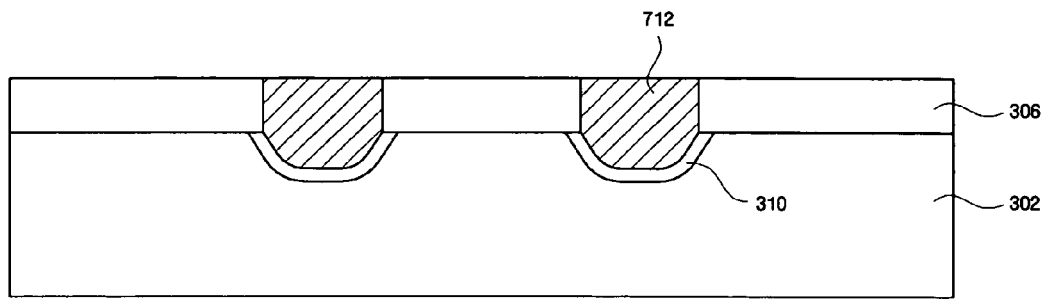
Figure 8E:
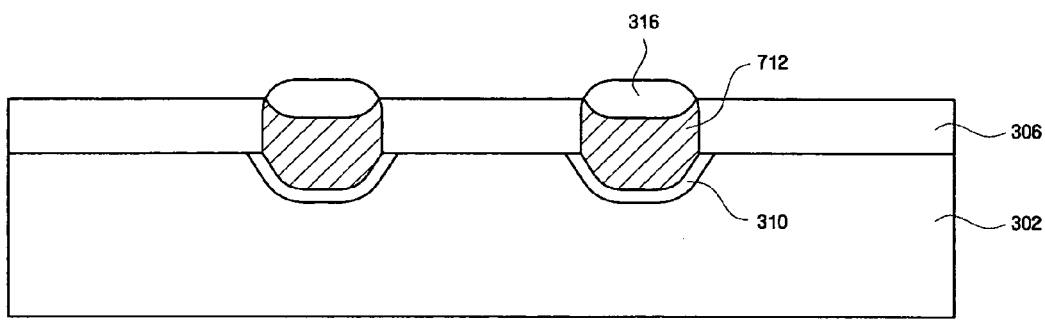
Figure 8F:
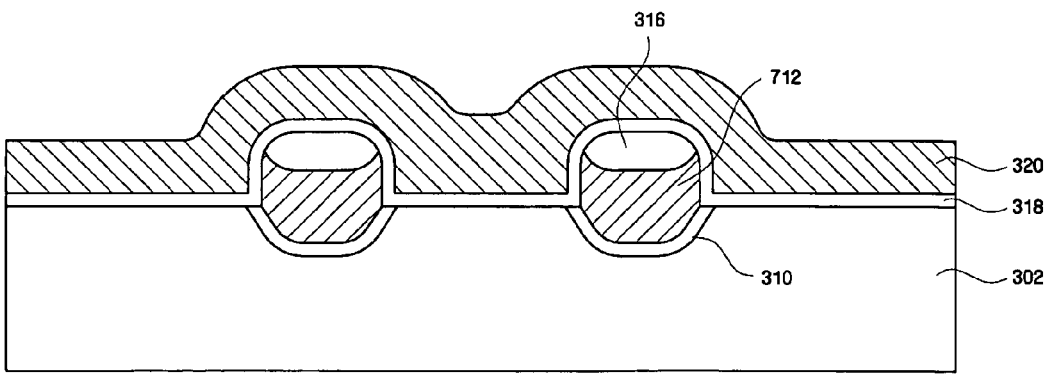
Figure 8G:
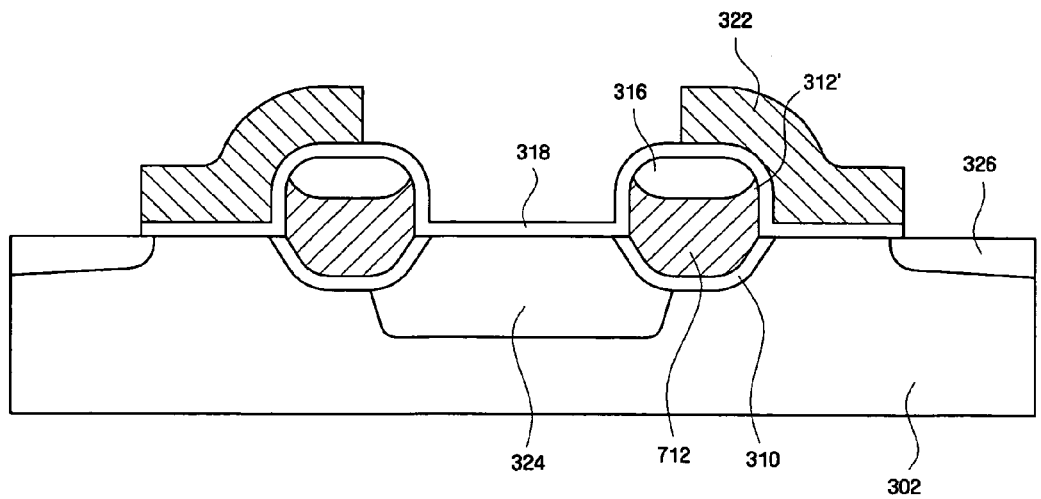

Referring to FIG. 8C, thermal oxide layer 707 is wet-etched using antioxidation layer pattern 306 as an etching mask to form a trench 708 in substrate 302. Trench 708 is preferably formed to a depth of about 500–2,000 Å. Trench 708 formed by the thermal oxidation process, in particular the bottom portion of trench 708 is rounded. That is to say, an angle between a sidewall of the trench 708 and a bottom of the trench 708 is substantially obtuse (greater than 90°).

Next, referring to FIGS. 8D through 8G, a gate insulating layer 310, a floating gate 712, an inter-gate insulating layer 316, a control gate 322, a source region 324, and a drain region 326 are formed in the same manner as in the first embodiment.

Hereinafter, a nonvolatile memory device according to a fourth embodiment of the present invention will be described with reference to FIGS. 9A through 9C. The basic layout of the nonvolatile memory device according to this embodiment is the same as FIG. 2, and also has the same sectional structure as shown in FIG. 7. For convenience of illustration, the same reference numerals as used in the third embodiment refer to the same constitutional elements, and thus, the detailed descriptions thereof are omitted.

The nonvolatile memory device of this embodiment has the same structure as that of the third embodiment except for the differences detailed below. That is, this embodiment provides a nonvolatile memory device manufacturing method capable of preventing formation of a bird's beak at a lower portion of an antioxidation layer pattern 306 when a trench is formed in a substrate 302 by a thermal oxidation process.

The nonvolatile memory device according to the fourth embodiment of the present invention executes similar operations, and thus exhibits similar behaviors and effects as that of the third embodiment. A method of manufacturing a nonvolatile memory device according to a fourth embodiment of the present invention will now be described with reference to FIGS. 9A through 9C.

Figure 9A:
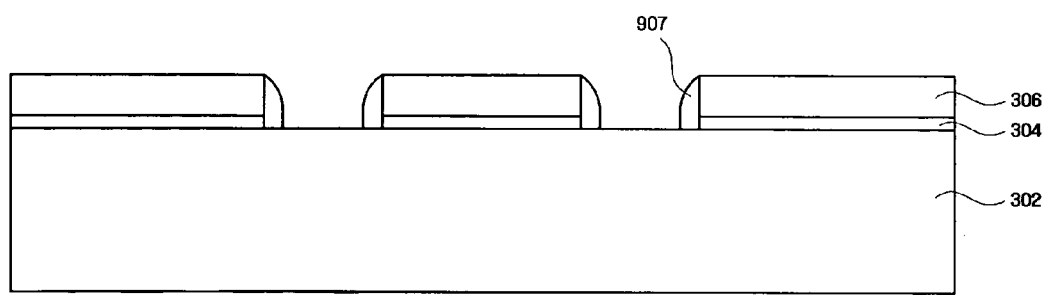
FIGS. 9A through 9C are sequential sectional views illustrating a method of manufacturing a nonvolatile memory device according to a fourth embodiment of the present invention.

Referring to FIG. 9A, an oxide layer pattern 304 and an antioxidation layer pattern 306 defining a trench are sequentially formed on a substrate 302. Antioxidation layer pattern 306 serves as a mask in a subsequent thermal oxidation process to form a trench. Antioxidation layer pattern 306 may also serve as a mask in a subsequent process to form a floating gate. Antioxidation layer pattern 306 is preferably a nitride layer, and is formed to a thickness of about 100–1,000 Å. Oxide layer pattern 304 serves to decrease the stress between substrate 302 and antioxidation layer pattern 306, and is preferably formed to a thickness of about 100–200 Å. However, the formation of the oxide layer pattern 304 may be omitted depending on process conditions.

Next, a conductive layer (not shown) of polysilicon is formed to an appropriate thickness on the entire surface of substrate 302. Then, the conductive layer is etched by an anisotropic etching process or an etch-back process, for example, a Reactive Ion Etching (RIE) process, to form a spacer 907 on inner walls of antioxidation layer pattern 306.

Figure 9B:
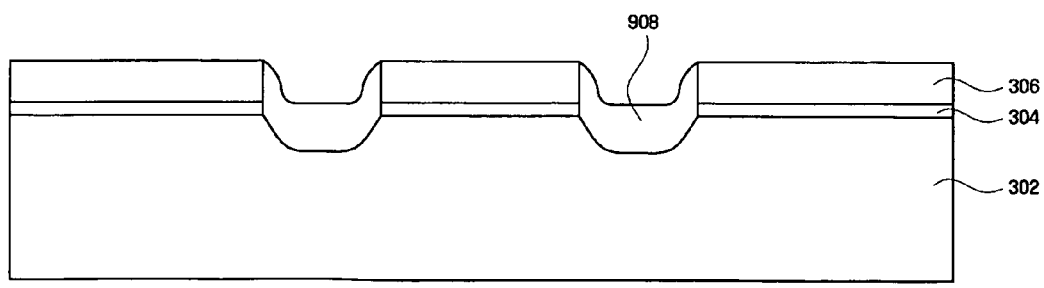
Figure 9C:
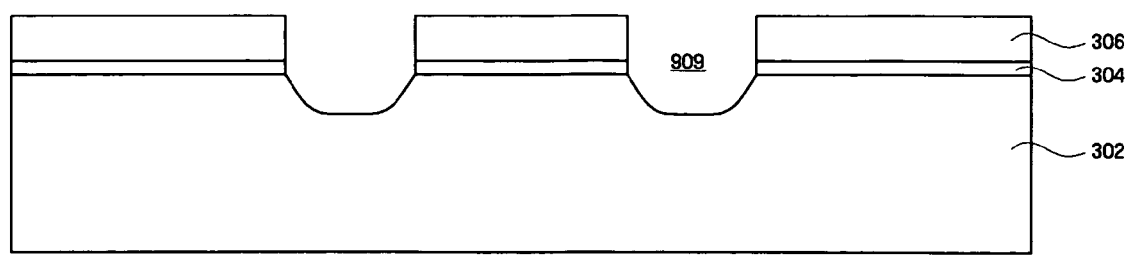

Referring to FIGS. 9B and 9C, using antioxidation layer pattern 306 as a mask, spacer 907 is thermally oxidized so that most of spacer 907 is consumed to form a thermal oxide layer 908 in substrate 302. Thermal oxide layer 908 is removed by a wet etching to form a trench 909 in substrate 302 having a round bottom. Spacer 907 serves to prevent the formation of the bird's beak when substrate 302 is oxidized to form trench 909.

Subsequent processes are the same as detailed in FIGS. 8C through 8G of the third embodiment.

In concluding the detailed description, those skilled in the art will appreciate that many variations and modifications can be made to the preferred embodiments without substantially departing from the principles of the present invention.

What is claimed is:

1. A nonvolatile memory device comprising:
    a floating gate comprising a lower portion in a trench defined in a surface of a substrate and an upper portion above the surface of the substrate, wherein the upper portion comprises a concave upper surface;
    a gate insulating layer on inner walls of the trench and interposed between the trench and the lower portion of the floating gate;
    a source region in the substrate proximate a first sidewall of the trench;
    a control gate comprising a first portion on the substrate proximate a second sidewall of the trench opposite the first sidewall, and a second portion on at least a portion of the upper portion of the floating gate;
    an inter-gate insulating layer on the concave upper surface of the upper portion of floating gate and interposed between the floating gate and the control gate;
    a tunneling insulating layer on the inter-gate insulating layer and interposed between the inter-gate insulating layer and the control gate; and
    a drain region in the substrate proximate to and spaced apart from the second sidewall of the trench.

2. The nonvolatile memory device of claim 1, wherein the trench has a depth of 500–2,000 Å.

3. The nonvolatile memory device of claim 1, wherein the floating gate comprises a polysilicon layer, or a polysilicon layer obtained by ion implantation with impurity.

4. The nonvolatile memory device of claim 1, wherein a junction depth of the source region is greater than a bottom surface of the lower portion of the floating gate.

5. The nonvolatile memory device of claim 1, wherein the floating gate comprises a metallic conductive layer, or a stacked layer comprising a polysilicon layer and a silicide.

6. The nonvolatile memory device of claim 1, wherein the tunneling insulating layer comprises a nitride, an oxinitride, a high k material or a combination thereof.

7. The nonvolatile memory device of claim 1, wherein the tunneling insulating layer comprises a mono-layer formed from a MTO, a multi-layer formed from a thermal oxide or a MTO, or an insulating layer formed by $N_2O$ annealing of a multi-layer.

8. The nonvolatile memory device of claim 1, wherein a vertical thickness of the lower portion of the floating gate is greater than a vertical thickness of the upper portion of the floating gate.

9. The nonvolatile memory device of claim 8, wherein an angle between a side surface and a bottom surface of the lower portion of the floating gate is substantially a right angle.

10. A nonvolatile memory device comprising:
    a floating gate comprising a lower portion in a trench defined in a surface of a substrate and an upper portion above the surface of the substrate;
    a gate insulating layer interposed between inner walls of the trench and the lower portion of the floating gate, wherein the gate insulating layer is made of a nitride, an oxinitride, a high-k material, or a combination thereof;
    a source region disposed in the substrate proximate a first sidewall of the trench;
    a control gate comprising a first portion on the substrate proximate a second sidewall of the trench opposite the first sidewall, and a second portion over at least a portion of the floating gate;
    an inter-gate insulating layer on the upper portion of the floating gate and interposed between the floating gate and the control gate; and,
    a drain region disposed in the surface of the substrate proximate to and spaced apart from the second sidewall of the trench.

11. The nonvolatile memory device of claim 10, wherein the gate insulating layer is a $N_2O$-annealed MTO monolayer, a N₂O-annealed multi-layer composed of a thermal oxide layer and a MTO layer, or a N₂O-annealed multi-layer composed of a thermal oxide layer, a SiON layer, and a MTO layer.

12. The nonvolatile memory device of claim 10, wherein the gate insulating layer is an ONO layer composed of an oxide layer, a nitride layer, and an oxide layer.

13. The nonvolatile memory device of claim 10, wherein the gate insulating layer is a stacked layer comprising at least one of an oxide layer, a nitride layer, and a high-k material layer.

14. The nonvolatile memory device of claim 10, wherein the lower portion of the floating gate has a first thickness and the upper portion of the floating gate has a second thickness less than the first thickness.

15. The nonvolatile memory device of claim 14, wherein the second thickness ranges from between 100 and 1,000 Å above the surface of the substrate.

16. A nonvolatile memory device comprising:
   a floating gate comprising a lower portion in a trench defined in a surface of a substrate and an upper portion above the surface of the substrate, wherein the floating gate has a "U" sectional shape comprising first and second ends separated by a fold portion filled with an insulating material;
   a gate insulating layer formed interposed between inner walls of the trench and the lower portion of the floating gate;
   a source region disposed in the substrate proximate a first sidewall of the trench;
   a control gate comprising a first portion on the substrate proximate a second sidewall of the trench opposite the first sidewall, and a second portion on at least a portion of the upper portion of the floating gate;
   an inter-gate insulating layer on the first and second ends of floating gate;
   a tunneling insulating layer on the inter-gate insulating layer and an upper surface of the insulating material filling the fold portion of the floating gate; and,
   a drain region disposed in the substrate proximate to and spaced apart from the second sidewall of the trench.

17. The nonvolatile memory device of claim 16, wherein an angle between a side surface and a bottom surface of the lower portion of the floating gate is substantially a right angle.

18. The nonvolatile memory device of claim 16, wherein the inter-gate insulating layer comprises two separate discrete layers respectively formed on upper surfaces of the first and second ends.

19. The nonvolatile memory device of claim 16, wherein the insulating material filling the fold portion comprises a oxide or a nitride.

20. A nonvolatile memory device comprising:
   a floating gate comprising a lower portion in a trench defined in a surface of a substrate, and an upper portion above the surface of the substrate, wherein lower portion has a vertical thickness less than the vertical thickness of the upper portion;
   a gate insulating layer interposed between the trench and the lower portion of the floating gate;
   an inter-gate insulating layer on the upper portion of the floating gate;
   a control gate comprising a first portion on the substrate over one sidewall of the trench, and a second portion over at least a portion of the inter-gate insulating layer;
   a drain region in the substrate proximate and spaced apart from the one sidewall of the trench; and,
   a source region in the substrate proximate another sidewall of the trench opposite the one sidewall.

21. The nonvolatile memory device of claim 20, wherein the gate insulating layer comprises a nitride, an oxinitride, a high-k material, or a combination thereof.

22. The nonvolatile memory device of claim 20, wherein the gate insulating layer is a N₂O-annealed MTO monolayer, a N₂O-annealed multi-layer composed of a thermal oxide layer and a MTO layer, or a N₂O-annealed multi-layer composed of a thermal oxide layer, a SiON layer, and a MTO layer.

23. The nonvolatile memory device of claim 20, wherein the gate insulating layer is an ONO layer comprising of an oxide layer, a nitride layer, and an oxide layer.

24. The nonvolatile memory device of claim 20, wherein the gate insulating layer is a stacked layer comprising at least one of an oxide layer, a nitride, and a high-k material layer.

* * * * *